(12) United States Patent
Fasching et al.

(10) Patent No.: US 11,675,015 B1
(45) Date of Patent: *Jun. 13, 2023

(54) BATTERY CELL ANALYZER

(71) Applicant: Maxim Integrated Products, Inc., San Jose, CA (US)

(72) Inventors: Rainer Fasching, Mill Valley, CA (US); Georgy Zerkalov, Santa Clara, CA (US); Tina Alikahi, San Jose, CA (US); Jason Wortham, San Jose, CA (US); Hushnak Singh, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 30 days.

This patent is subject to a terminal disclaimer.

(21) Appl. No.: 17/367,582

(22) Filed: Jul. 5, 2021

Related U.S. Application Data (63) Continuation of application No. 16/048,117, filed on Jul. 27, 2018, now Pat. No. 11,061,076.

(60) Provisional application No. 62/537,912, filed on Jul. 27, 2017.

(51) Int. Cl.
    *G01R 31/385* (2019.01)
    *G01R 31/367* (2019.01)

(52) U.S. Cl.
    CPC ......... *G01R 31/385* (2019.01); *G01R 31/367* (2019.01)

(58) Field of Classification Search
    CPC ............ G11C 13/0038; G11C 13/0069; G11C 2013/0078; C25D 11/005; C25D 11/04; C25D 11/024
    USPC ....... 324/500, 600, 400, 416, 425–434, 522, 324/713, 72.5, 76.11, 76.39, 76.77, 98, 324/111, 120
    See application file for complete search history.

(56) References Cited

U.S. PATENT DOCUMENTS

| | | | |
|---|---|---|---|
| 2001/0028238 A1 | 10/2001 | Nakamura et al. | |
| 2002/0140433 A1 | 10/2002 | Lawson et al. | |
| 2017/0153290 A1* | 6/2017 | Sazhin | G01R 31/396 |
| 2017/0187201 A1 | 6/2017 | Wang | |
| 2018/0164363 A1* | 6/2018 | Brorein | G01R 31/367 |

* cited by examiner

*Primary Examiner* — Lee E Rodak
*Assistant Examiner* — Trung Q Nguyen
(74) *Attorney, Agent, or Firm* — TIPS Group (57) ABSTRACT

An integrated circuit device includes a controller, a voltage source coupled to the controller, a voltage sampler coupled to the controller, a to current detector coupled to the controller and memory coupled to the controller, where memory includes code segments executable by the controller for: (a) measuring a cell voltage to determine an initial voltage; (b) holding the cell voltage at the initial voltage using a power source; and (c) determining the leakage current of the cell by the current provided by the current power source with a low current detector. The power source can be one or both of a voltage source and a current source.

13 Claims, 12 Drawing Sheets

| Type | Mode | Value | Limit | Value | EndType | Op | Value | Goto | ReportType | Value | Options |
|---|---|---|---|---|---|---|---|---|---|---|---|
| Rest | | | | | Step Time | = | 00:02:00 | 002 | Step Time | 00:00:01 | ANNN |
| | | | | | | | | | Set Variable atStart VAR1=0 | | |
| | | | | | | | | | Set Variable atStart VAR2=0 | | |
| | | | | | | | | | Set Variable atStart VAR3=0 | | |
| Rest | | | | | Step Time | = | 00:00:02 | 003 | Step Time | 00:00:00.1 | ANNN |
| | | | | | | | | | Set Variable atCONT: VAR1=VAR1+VOLT | | |
| | | | | | | | | | Set Variable atCONT: VAR2=VAR2+1 | | |
| | | | | | | | | | Set Variable atCONT: VAR3=VAR1+VAR2 | | |
| Chg Func Voltage | | 3.5VAR3 | | | Step Time | = | 02:00:00 | 004 | Step Time | 00:00:01 | NNN |

BATTERY CELL ANALYZER

CROSS REFERENCE TO RELATED APPLICATION(S)

This application is a continuation of U.S. Ser. No. 16/048,117, filed Jul. 27, 2018 which claims the benefit of U.S. Ser. No. 62/1537,912, filed Jul. 27, 2017, both of which are incorporated herein by reference,

BACKGROUND

Electrochemical batteries, each including one or more cells, are used to power many types of electrical and electronic devices. While they come in many shapes, forms, and chemistries, the two main categories are primary cells and secondary cells. Primary cells are non-rechargeable batteries and include the common household alkaline battery made with zinc, manganese oxide and carbon. Secondary cells are rechargeable batteries and include the lead-acid batteries traditionally used in combustion engine automobiles and lithium-ion batteries used in everything from cellular telephones to modern electric automobiles.

Figure 1:
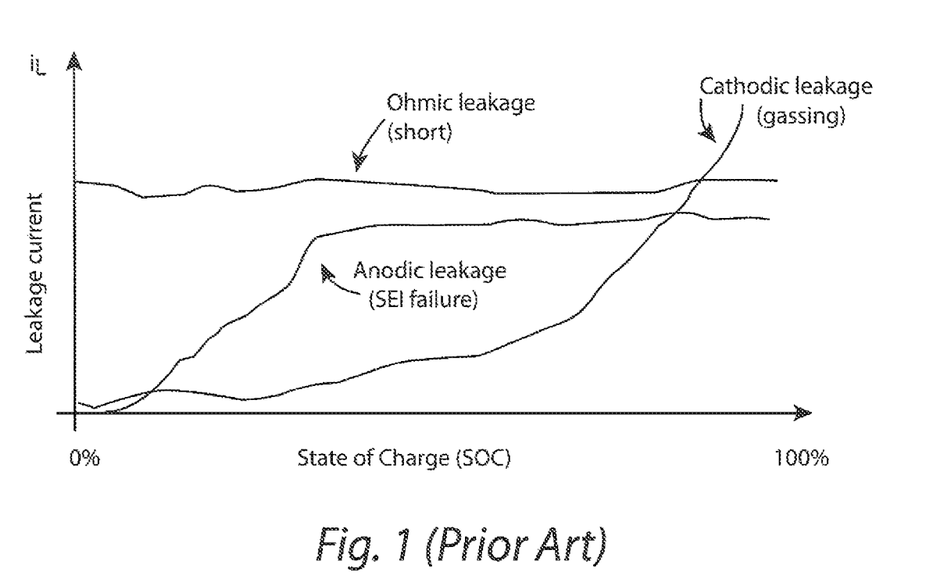
FIG. 1 is a graph illustrating various types of leakage currents in battery cells.

Batteries invariably fail over time due to leakage and other factors. There are three main leakage types that lead to various failure modes, including: (1) ohmic leakage, usually associated with an electronic shunt caused by mechanical defects or metallic and Li plated dendrites; (2) cathodic leakage, usually accompanied with gassing phenomenon and associated with side reactions on the cathode interface at higher states of charge and overall electrolyte instability; and (3) the anodic leakage, associated with side reactions on the anode due to SEI failure. These leakage types, graphed as Leakage Current v. State of Charge (SOC), are illustrated graphically in FIG. 1.

Common methods of leakage detection used in the industry include: (1) the self-discharge method; and (2) the high precision charge counting method. The first method of leakage detection is based on measuring open circuit voltage (OCV) changes caused by self-discharge within the cell. This method is slow (can take up to several days to complete), requires high-precision voltage measurement (usually in mV range), and requires well equilibrated cells because, for example, a 10K Ω leakage resistor will typically cause less than a mV of voltage drop per hour.

The second method of leakage detection is based on the phenomenon that leakage current artificially increases the capacity of the cell during charge and discharge cycles. This method requires high precision charge counter and very accurate measurements of states of charge of the cell. The precise capacity of the battery under assessment needs to be known, Besides the need of a very precise coulomb counter, this method cannot provide fast feedback because of the need to charge the cell to a 100% state of charge.

Therefore, the two methods of leakage detection in current use are slow, measure only average current leakage and do not provide information about leakage type at different states of charge (SOC). They also do not provide information about the various modes of failure or provide insight on how to prolong the life of the battery under test.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

EMAILED DESCRIPTION OF EXAMPLE EMBODIMENTS

Examples provided herein are related to direct leakage current measurements, as opposed to calculating leakage currents from other parameters, such as voltage and resistance. In certain example embodiments, rapid and accurate detection of current leakage of less than 1 mA, and an assessment of the leakage at different states of charge, is obtained in a relatively short period of time.

Figure 2:
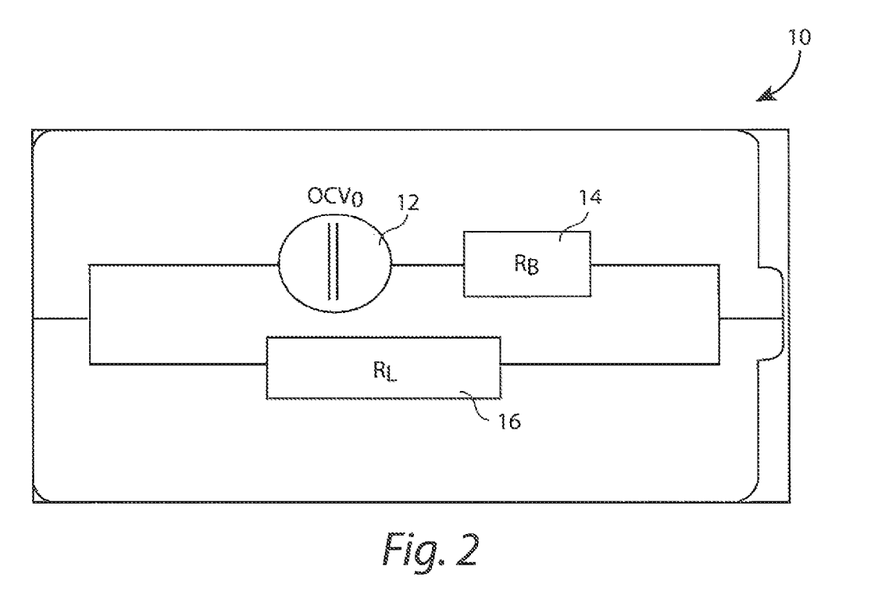
FIG. 2 is a block diagram of a model battery cell.

With reference to FIG. 2, cell 10 is modeled herein as a voltage source 12 with a resistor 14 ($R_B$) in series with the source to represent cell impedance and a resistor 16 ($R_L$) parallel with the source to represent the cell leakage resistance. The initial open circuit voltage for cell 10 is given as $OCV_0$.

It should be noted that all cells have impedance and leakage resistances. The higher the impedance of the cell and the lower the value of the leakage resistor, the more poorly the cell performs. By way of non-limiting example, a cell impedance $R_B$ value varies between one to couple of hundred milliohms (mΩ), The leakage resistance of a typical cell will fall between 100 kilo ohms (kΩ) and 100 mega ohms (MΩ). A leaky cell will have lower leakage resistance, thus higher leakage current.

Example embodiments include one or more modes of leakage detection, e.g. a static mode and/or a dynamic mode. The static mode approach allows one to rapidly detect leakage of equilibrated (relaxed) cells. The dynamic mode approach allows one to detect current leakage of unequilibrated cells exiting the charge phase. The dynamic and static modes may be combined to detect the current leakage of semi-relaxed cells.

For relaxed cells, a static leakage detection method may be used to measure current leakage. In this case, a current source measures the voltage of the relaxed cell and then holds the cell at that voltage. A voltage averaging step sets the source's voltage closely to the level of the cell's voltage.

Most of the noise in measured voltage comes from circuitry associated with the cell: e.g. printed circuit boards, connectors and wiring of the setup. With certain example processes described herein, if the applied voltage is higher than the cell's voltage, the source feeds current to charge the battery to the source's level before driving the leakage current. If the applied voltage is lower than the cell's voltage, then the current source has to act as a current sink to discharge the battery for the voltages of the cell and the source to be equal. Thus, in this example embodiment it is desirable that the voltage of the source is set to be as close as possible to the cell's voltage.

Figure 3A:
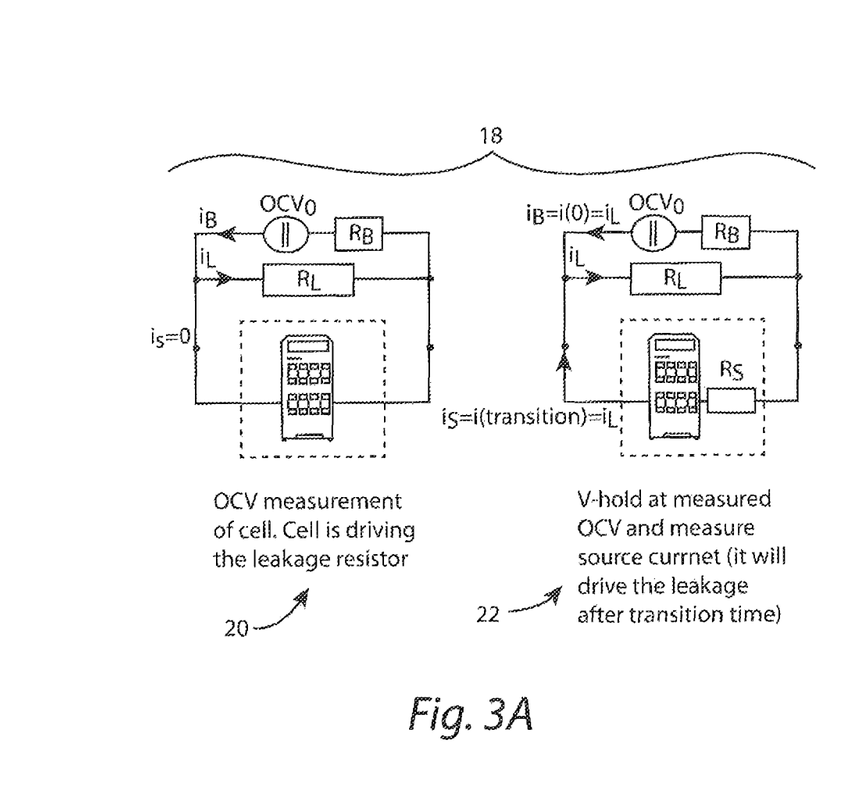
FIG. 3A illustrates a direct leakage detection process.
Figure 3B:
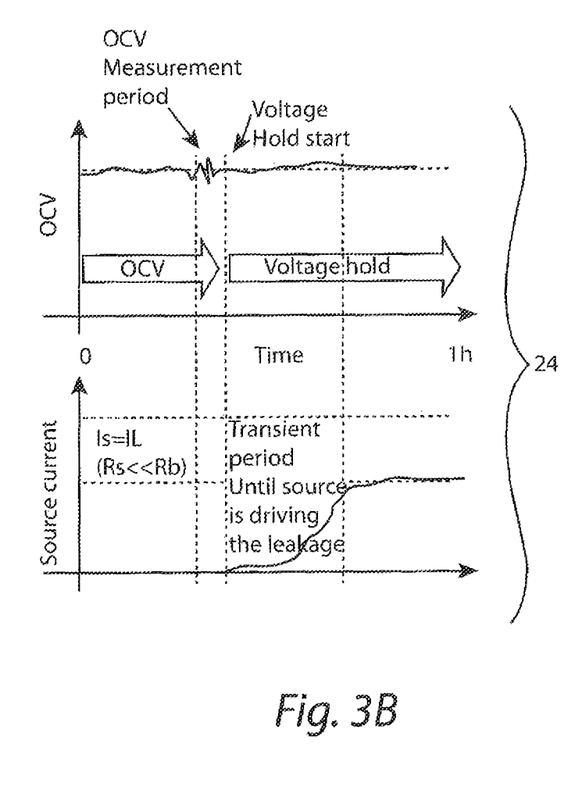
FIG. 3B includes graphs illustrating the process of FIG. 3A.

With reference to FIG. 3, a direct measure of leakage current within a battery cell can be made by measuring the cell's voltage at a certain period of time and holding the battery at that voltage using a current source. The current provided by the current source will be the same as the leakage current after a transition time. By way of non-limiting example, a direct leakage detection process 18 includes a precise cell voltage detection 20 step and a voltage hold process 22 step. The voltage hold process 22, in this example, includes the application of current source at the same voltage as the one measured for that particular cell and that particular state of charge. Initially, before the application of the current source, the leakage resistor 16 is solely driven by the cell. Once the current source starts holding the cell at the measured voltage, it will eventually take over the leakage resistor after the transition time. In FIG. 3B, graphs 24 graphically illustrate the operation of process 18.

Figure 4:
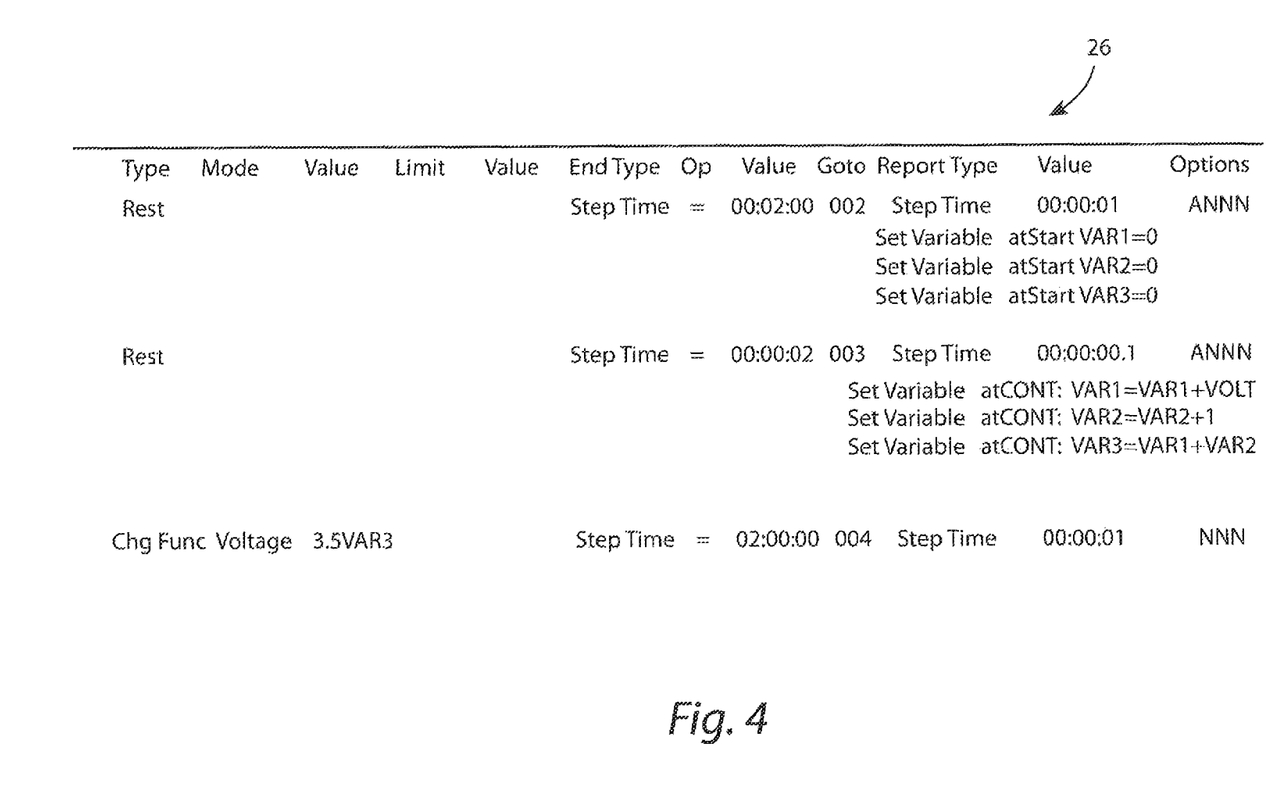
FIG. 4 is a listing of steps for a test procedure.

With reference to FIGS. 4, an example process for static current detection includes a test procedure 26. In the test procedure 26, all variables used in voltage averaging are first set to zero. Next, incremental voltage is recorded to variable 1 (VAR1), while the number of incremental voltage recordings is recorded into variable 2 (VAR2). Finally, variable 3 (VAR3)—ratio of VAR1 and VAR2—is obtained with the value of average voltage recorded in the last 2 seconds, in this example. Once the average voltage is obtained, the current source can hold that voltage and record any resulting current, which corresponds to leakage current after the transition time. Test procedure 26 is preferably a computer-implemented process including code segments stored in non-transitory computer readable memory which are executed on an associated processor.

Figure 5:
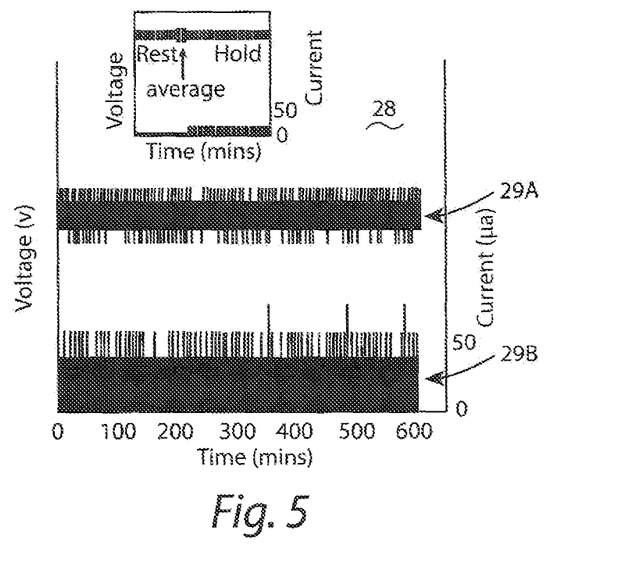
FIG. 5 is a graph illustrating a leakage measurement with no leakage resistor (control)

FIG. 5 includes a graph 28 which illustrates a leakage measurement with no resistor (control). On graph 28, a voltage signal is shown at 29A, and a current signal is shown at 29B. It will be appreciated that the current signal 29B is noise. The procedures described above reduce the voltage noise measured by a voltage sensing device by averaging the voltage over past data points.

Figure 6:
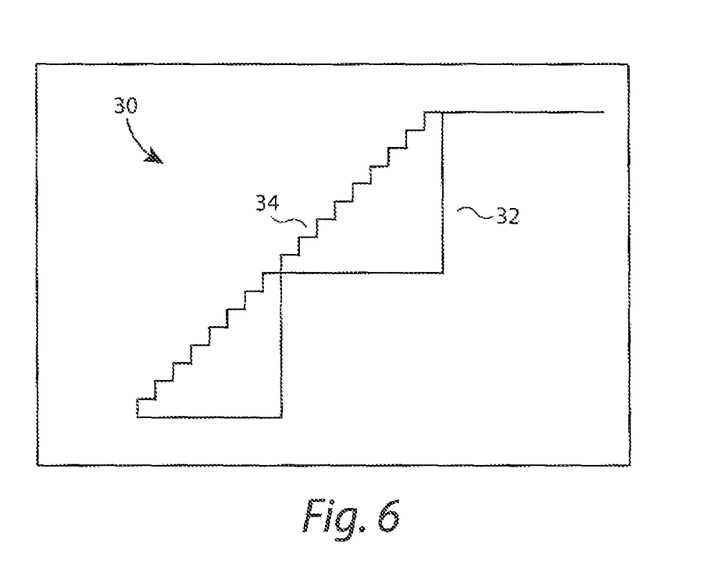
FIG. 6 is an illustrating of a process for matching a voltage of a battery cell with the voltage source.

FIG. 6 is an illustration of an example process 30 for matching the voltage of the source with the voltage of the cell, The process 30 includes the implementation of a rough digital-to-analog converter (DAC) 32 and a fine digital-to-analog converter (DAC) 34 combination. Since the absolute accuracy of matching voltage with the comparator is not required, it is possible to find the right voltage setting by searching the rough DAC 32 until the comparator is moved and then move the fine DAC 34 until the comparator is moved again. For this method one can use, for instance, two 8-bit DACs (non-monotonic) instead of a very high resolution DAC and achieve a fraction of mV voltage step.

Figure 7:
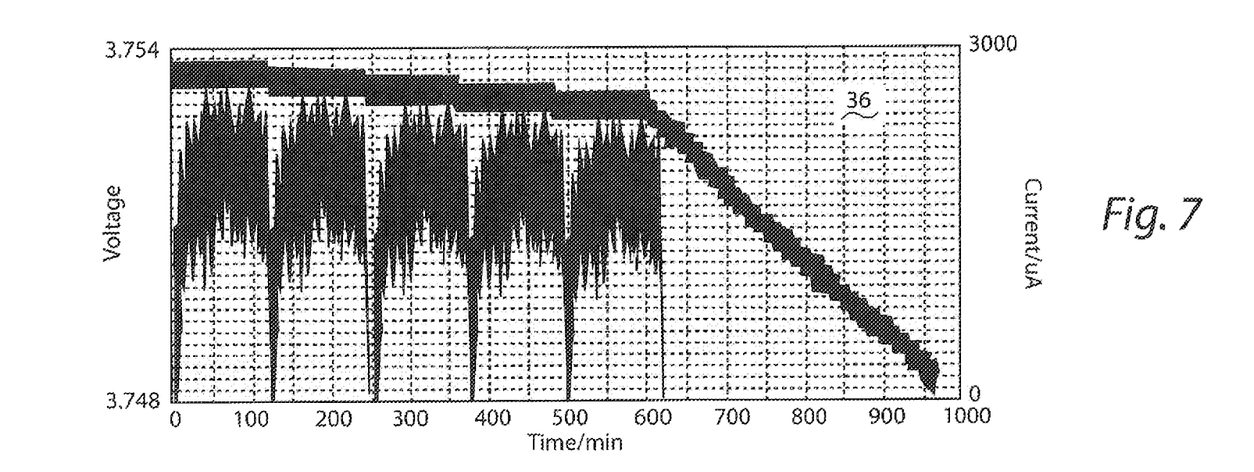
FIGS. 7 and 8 are graphs illustrating a static method used to detect leakage in relaxed cells.
Figure 8:
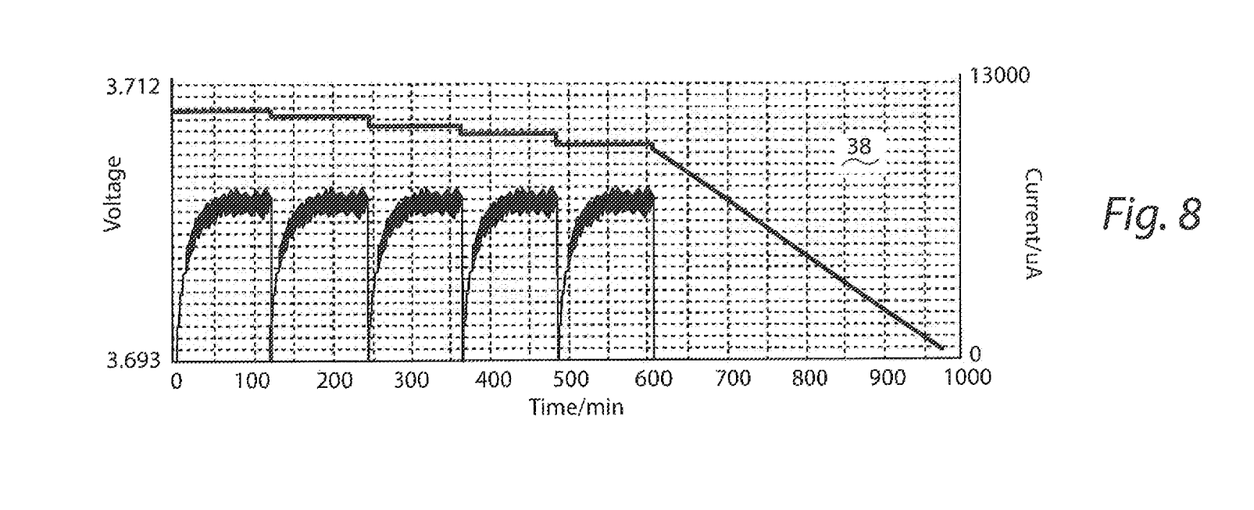

As illustrated by the graphs of FIGS. 7 and 8, example static mode methods are used to detect leakage in relaxed cells. In the graph 36 of FIG. 7, with a 2KΩ leakage resistor a cell leakage of approximately 1900 uA was detected. In the graph 38 of FIG. 8, current leakage caused by a 500 Ω resistor was measured to be approximately 7500 uA. It is also noted that the transition time decreases once the $R_B$ value decreases. While it is not possible to easily modify the $R_B$ value of a cell, it is possible to decrease the $R_B$ value of the circuitry that lies between the cell and the voltage sensing device.

The transition time may be approximated by several methods. For example, it is noted that the voltage drop across the leakage resistor $R_L$ is the product of the leakage current $I_L$ and leakage resistor $R_L$. The voltage drop across the impedance resistor is the product of the leakage current and impedance resistor of the cell. The leakage current is the ratio between the Open Cell Voltage (OCV) of the cell and the sum of leakage and impedance resistors. The measured OCV of a leaky cell ($V_M$) is therefore expressed as the difference between OCV and yielding OCV-OCV* $R_B/(R_B+R_L)$.

$$V_{RL}=(R_L*i_L),$$

$$V_{Rb}=R_B*i_L$$

$$i_L=OCV/(R_B+R_L)$$

$$V_M=V_{RL}=OCV-R_B*i_L=OCV-OCV*R_B/(R_B+R_L)$$

From the forgoing, it is determined that the transition time will end right after the cell discharges by the amount of the voltage drop of $R_B$. After that, the leakage resistor will be solely driven by the source. From the, known parameters of the cell, its capacity (C[Ah]) and its lower and higher cutoff voltages, the transition time can be calculated. Since $R_L$ is much larger than $R_B$, the leakage current is approximately equal to the ratio of measured OCV ($V_M$) and leakage resistance. The time required for the batter to self-discharge from full to empty is the ratio of capacity and the leakage current, $$TSD(\text{full to empty})=C/i_L$$

Linearizing the voltage curve of self-discharge, we are able to approximate the time required to discharge the cell b a certain amount of voltage.

$$TSD(V): \text{Self discharge time of an amount of V}$$

$$TSD(0.001\ V)=0.001V/DV*C/i_L$$

Therefore, the transition time required to discharge the battery by the amount of voltage drop of $R_B$ is equal to:

$$T_T=(R_B*i_L)/DV*C/i_L$$

By way of an example, with an $R_B$ of 10 m, an RL of 1K, an IL=OCD/RL=3-4 mA dependent on SOC, and a C=3 Ah, the transition time to discharge can be calculated as follows:

$$TSD(DV)=3\ Ah/(3-4)*10^{-3}A=1000-750\ h$$

$$TSD(1\ mV)=0.001V/1V*(1000-750\ h)=1\ h-0.75\ h$$

$$TT=10*10^{-3}\ Ohm*(3-4)*10^{-3}\ A/1V*1000-750\ h=2.4-1.35\ \text{minutes}$$

These calculations show that for leakage current correlating to a 0.001 C, self-discharge of the leakage current should be driven entirely by the source after a couple of minutes.

In dynamic leakage detection mode the cell is forced to a non-equilibrated state which could be achieved by charging the cell at, for instance, 0.1 C charge rate. In this case the current leakage detection may be achieved by differentiation of leakage current and charge/discharge current based on different time responses between self-discharge and equilibration.

Figure 9:
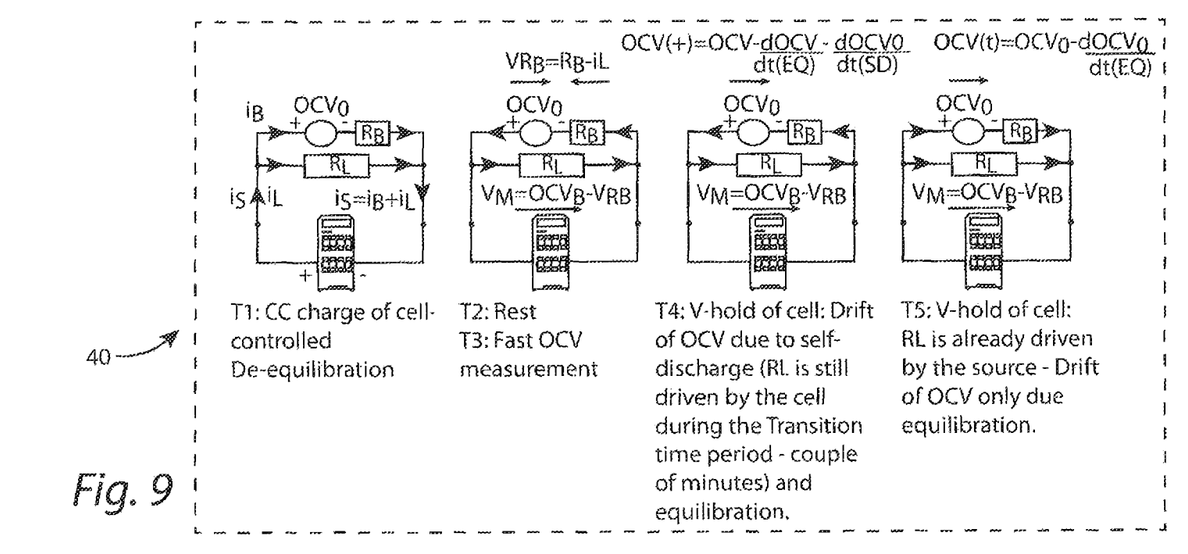
FIG. 9 illustrates an example dynamic leakage detection process.
Figure 10:
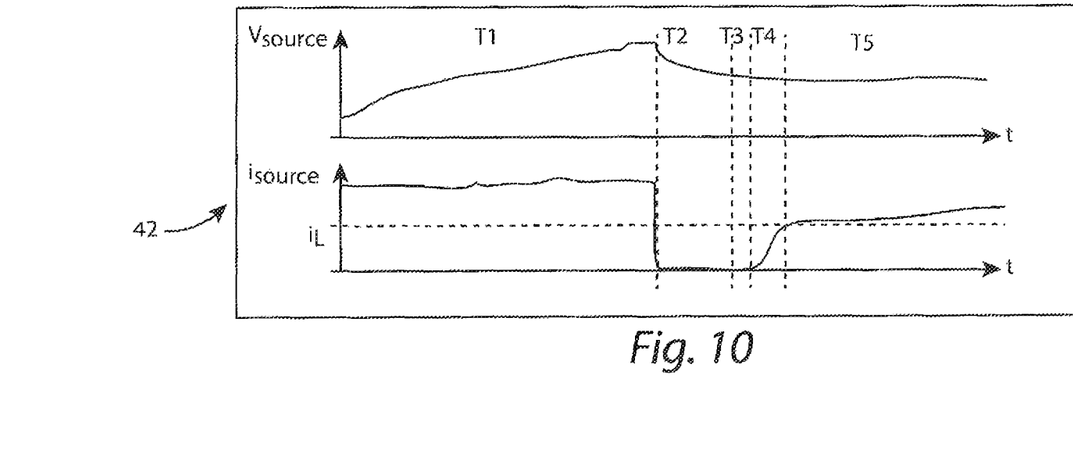
FIG. 10 graphically illustrates the operation of the process of FIG. 9.

FIG. 9 illustrates an example dynamic leakage detection process 40 and FIG. 10 includes graphs 42 illustrating the operation of dynamic leakage detection process. With reference to both FIGS. 9 and 10, in an example dynamic leakage detection mode, the cell is charged at constant current in Time 1 (T1). During this step the cell is de-equilibrated, and the current source increases the cell's voltage and drives both the impedance and leakage resistors. During the next step (T2), the cell rests for a few minutes. This step is intended for the elimination of fast response (IR drop). In the third time period, fast OCV measurements are taken and recorded to run the voltage averaging procedure, which is identical to the static leakage detection averaging procedure. During this step the leakage resistor is solely driven by the cell.

Figure 11:
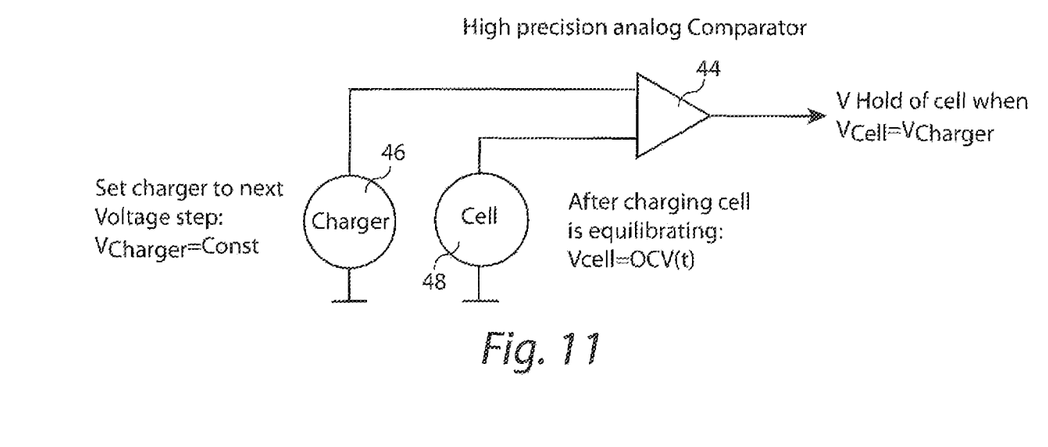
FIG. 11 is a block diagram of an apparatus for matching the voltage of a DUT battery cell to the voltage source.

With reference to FIG. 11, an example averaging procedure used to detect the dynamic leakage may be implemented in charging devices through several techniques including the use of a low offset high precision analog comparator 44. A charger 46 and a device under test (DUT) cell 48 are coupled to the inputs of the comparator 44. The charger 46, in this non-limiting example, has a low voltage step resolution of 5-10 mV. When the cell 48 equilibrates, the voltage drops, eventually hitting the next available charger voltage.

Figure 12:
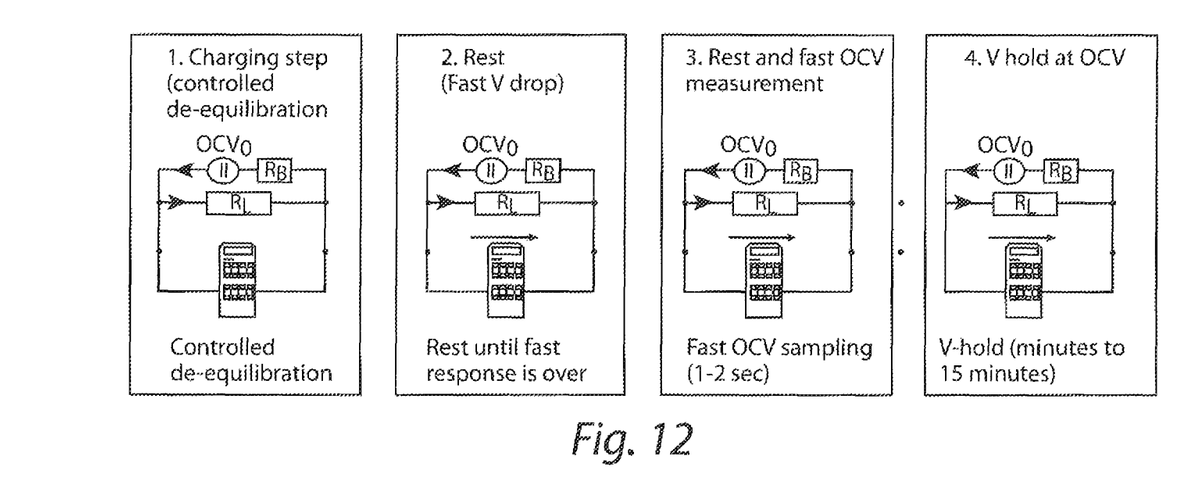
FIG. 12 illustrates an example dynamic leakage detection process with repeated rest/fast open circuit voltage (OVC) measurements

Another example method includes the use of the combination of rough and fine DACs, as described above with reference to FIG. 6. With reference to FIGS. 10 and 12, at Time 4 (T4) a voltage hold step is initiated, when the current source holds voltage at the average voltage measured in T3. During T4 there is a drift of OCV caused by the self-discharge of the cell and equilibration. The leakage resistor is still driven by the cell during the transition time, and the current source slowly starts taking over the leakage resistor. The beginning of the next stage (T5) characterizes the end of the transition time when the leakage resistor is driven solely by the current source. The drift of OCV is solely caused by the equilibration. The example process includes the following operational steps:

1. charging step (T1), causing controlled de-equilibration;
2. rest step, accompanied with fast voltage drop, caused by fast response (IR drop) and slow response (self-discharge and equilibration);
3. rest (T2) and fast OCV measurement step (T3) during voltages are measured and recorded for an averaging procedure;
4. voltage hold (T4 and T5) step (e.g. for 20 minutes) to calculate the cell's leakage current based on certain patterns; and
5. repeating steps 3 and 4 for a sufficient number of cycles.

Figure 13:
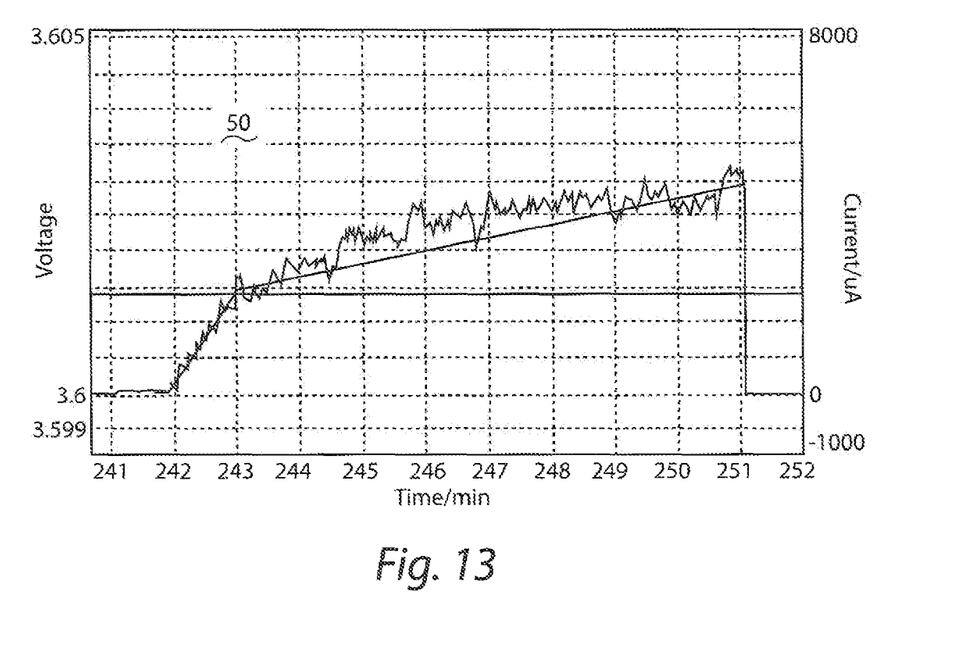
FIG. 13 is a graph illustrating a slope change corresponding from fast (self-discharge) to slow response (equilibrium)

In the example dynamic leakage detection mode described above, after the charging step the cell enters the rest phase. Initiating voltage hold during this rest phase, one starts seeing current that the source should provide to keep cell at that voltage. The current is attributed to cell's self-discharge and equilibration. The first phenomenon is fast response, while the second is slow response. In this case one would expect to see different patterns in the flow of current into the cell. For instance, one may expect to see different slopes or curve shapes for slow and fast responses. The transition point between the slow and the fast response corresponds to the leakage current. FIG. 13 includes a graph 50 illustrating an example of the slope change corresponding to switching from fast (self-discharge) to slow response (equilibration).

In certain example embodiments, the static and dynamic leakage detection modes are combined to detect leakage in semi-equilibrated cells. In certain embodiments, the voltage hold steps in static-dynamic leakage detection that lasts longer than in purely dynamic detection, e.g. up to an hour. During that time the cell equilibration will be mostly completed, and the detected current would only correspond to the leakage current.

Figure 14:
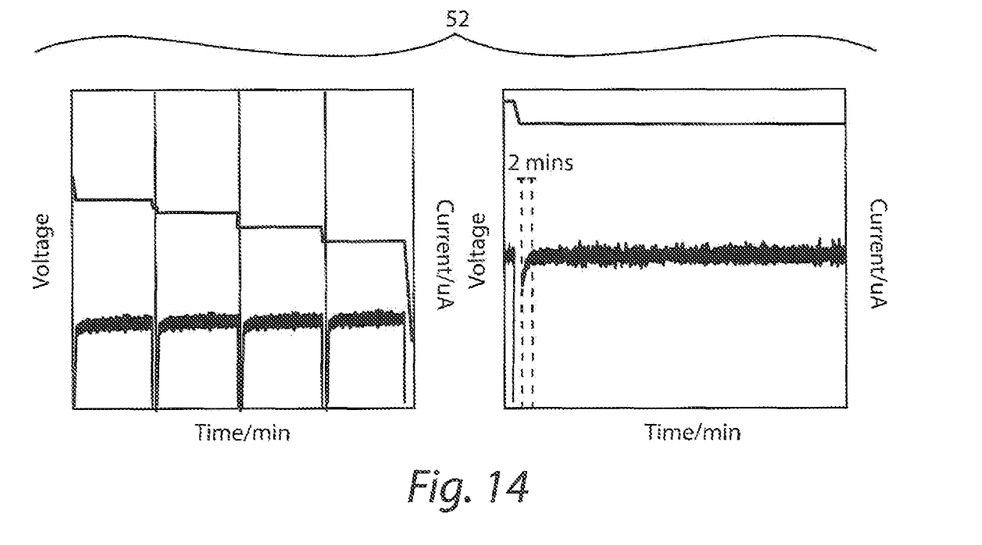
FIG. 14 graphically illustrates leakage detection on an energy cell.

In FIG. 14, leakage detection on an energy cell is illustrated in related graphs 52. As can be seen in these graphs, even with an energy cell there is a short detection time and good repeatability of the measurements.

Figure 15:
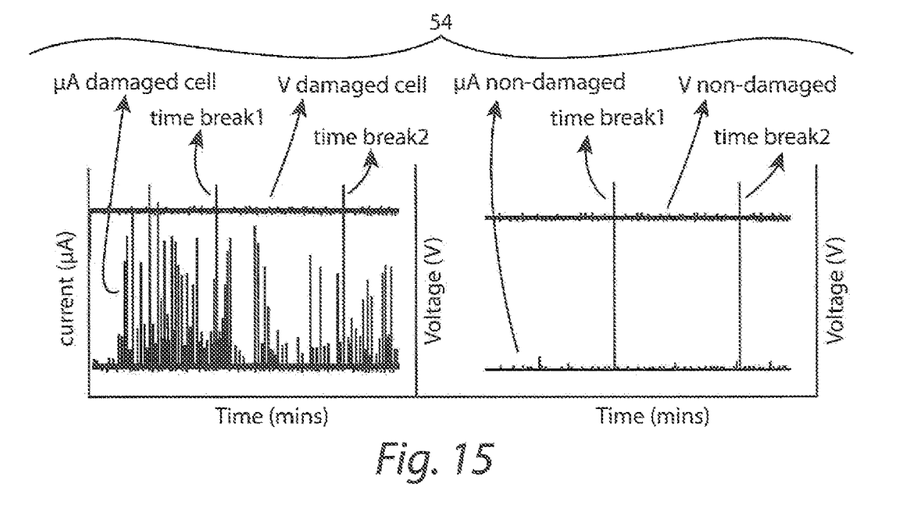
FIG. 15 includes related graphs comparing the leakage current of a defective cell with the leakage current of a non-defective cell in the context of transient current detection.

In FIG. 15, related graphs 54 compare the leakage current of a defective cell with the leakage current of a non-defective cell, illustrating how transient leakage current ("fluctuating currents") can be an indicator of unstable cells. The current fluctuations can be caused by several factors, including side reactions taking place in the cell or the development of Li dendrites. These fluctuating currents can advantageously be detected and measured with the novel direct leakage current detection methodologies described above, providing additional insight into the longevity and/or health of the cell.

To decrease the transition time one may use the voltage following mechanism to increase the voltage of current source and match it with the cell's voltage plus the $V_{Rb}$ value. The cell's impedance can be measured or is specified by the manufacturer. To decrease the transition time one needs to discharge cell by the value of $V_{Rb}$ as mentioned before. Nonetheless, instead of waiting for cell to discharge (transition time), the current source's voltage can be held at higher Value: measured OCV plus the $V_{RB}$. As noted previously, $V_{Rb}=R_B*I_L$. The $R_B$ value is known—it is the cell's impedance, but the $I_L$ and the $V_{Rb}$ are both unknown. However, when the correct value of $I_L$ or $V_{Rb}$, is found, the value of dI/dt approaches zero after the initial fast rise (fast response), since the slope of current decreases the closer we get to the $I_L$. It therefore follows the source's voltage can be set to higher values than the measured OCV to find $V_{RB}$ such that dI/dt=0. From here $I_L$ can easily be calculated. Alternatively, an approximation may be used in place of dI/dt to achieve the same result, e.g. by measuring current right after the fast response and at the end of the voltage hold step. The difference between the two approaches zero when close to the leakage current.

Figure 16A:
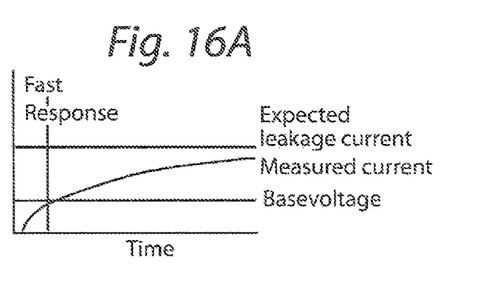
FIGS. 16A-16D are graphs illustrating how the measured current will reach the expected leakage current for different voltage source levels.
Figure 16B:
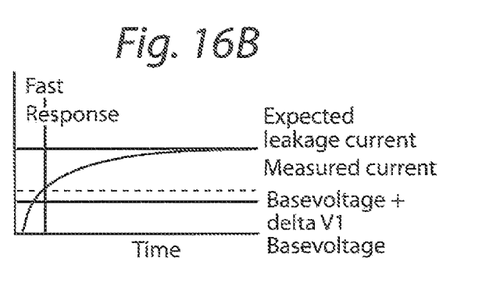
Figure 16C:
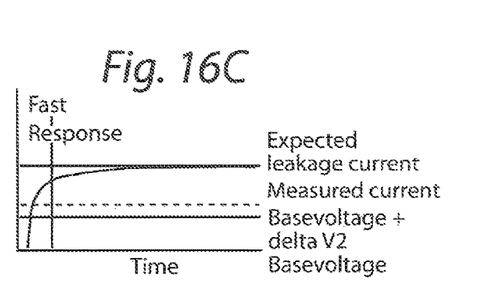
Figure 16D:
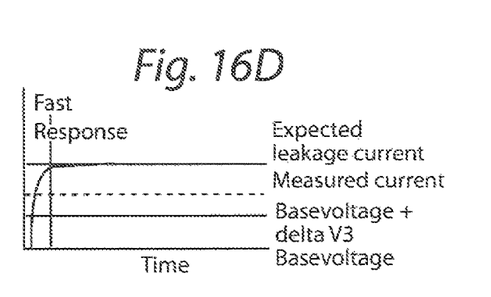

With reference to FIG. 16A, once the voltage of the source is set to the measured OCV, current will reach the expected leakage current after a transition time. In FIG. 16B, the voltage of the source is set higher than the measured OCV by delta (Δ) V1 (note that V1 and V2 and V3 used later are lower than $V_{RB}$). The transition time will become lower and the difference between the measured current at the end of the charge function and the measured current after fast response will be smaller. In FIG. 16C the voltage is set to base voltage plus ΔV2 where ΔV1<ΔV2<$V_{RB}$. The transition time further decreases, while the difference becomes even smaller. In FIG. 16D, ΔV3 is approximately equal to $V_{RB}$, and the fast response approaches a step function, while the difference of currents approaches zero. To consistently distinguish fast response, one could just measure current after certain time after the initiation of the charge function (voltage hold).

Figure 17:
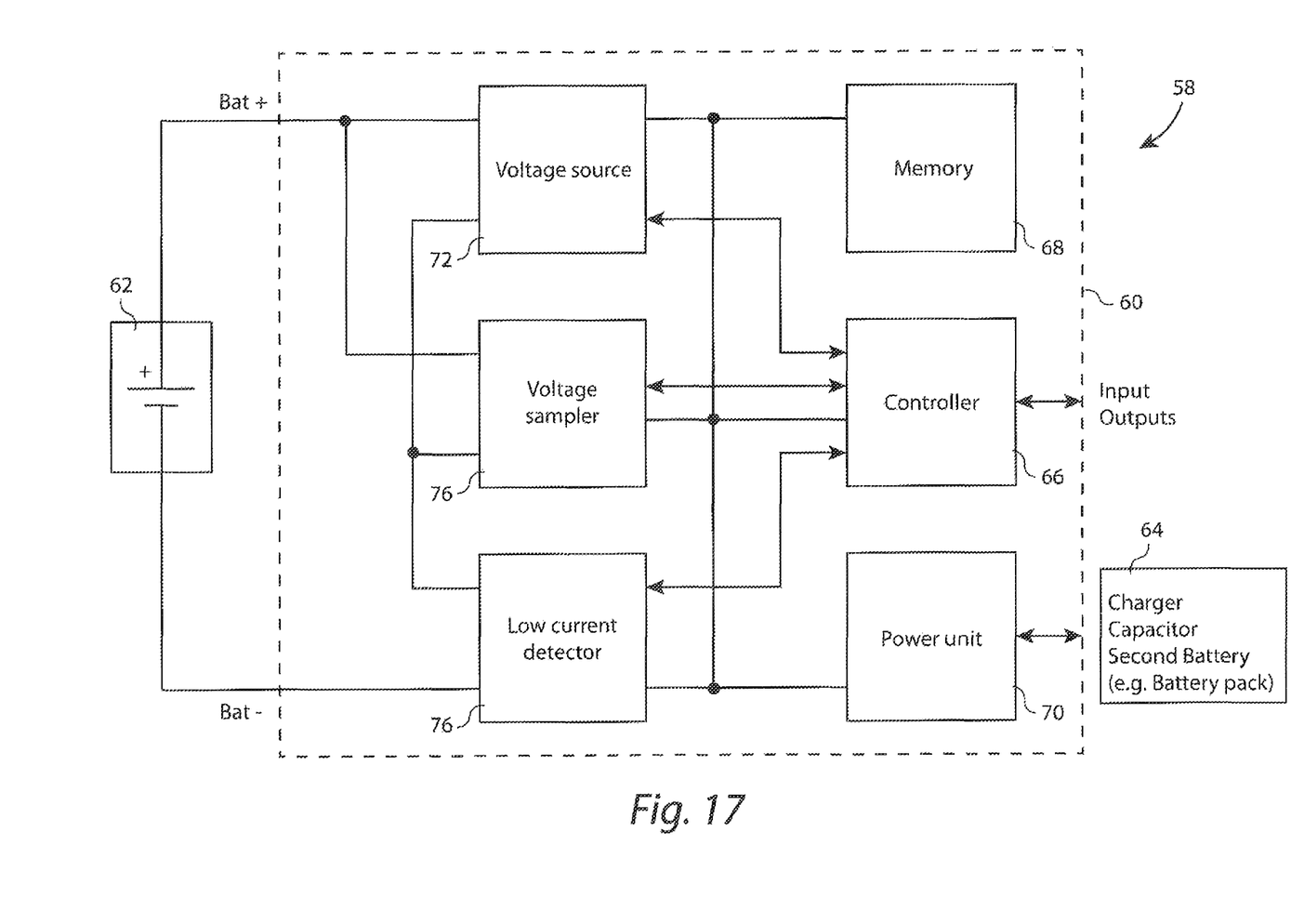
FIG. 17 is a block diagram of an example battery cell analyzing system.

In FIG. 17, a block diagram of a battery cell analyzing system 58 including a battery cell analyzer 60, a device under test (DUT) battery cell 62, and a power source 64. The battery cell analyzer 60 is, in a non-limiting example, provided as an integrated circuit (IC). However, the battery cell analyzer 60 may be implemented with discrete components, or combinations of discrete components and/or ICs. Furthermore, the battery cell analyzer 60 can be combined with the power source 64 and/or the barter/capacitor cell 62, as will be appreciated by those of skill in the art.

Example battery cell analyzer 60 includes a controller 66, a memory 68, a power unit 70, a voltage source 72, a voltage sampler 76 and a low current detector 76. Controller 66 is preferably a digital processor capable of executing code segments to implement various computer-implemented processes. A positive terminal of cell 62 is coupled to voltage source 72 and voltage sampler 76, while a negative terminal of cell 62 is coupled to the low current detector 76. It should be noted that when the voltage source 72 is maintained (e.g. regulated) at a particular voltage, such as $OCV_0$, it serves as a current source to provides whatever current is required to maintain that voltage level. The power source 64 can be any suitable power source, including a battery charger, a battery (e.g. a battery pack), a capacitor (which may be charged by the cell 62 or otherwise), etc.

A number of protocols ("processes") can be implemented for testing battery cells based upon the principals described herein. Some of these protocols, set forth by way of example, can be implemented by the battery cell analyzer 60. For example, code segments, executable by controller (processor) 66, can be stored in memory 68 to implement various example protocols. However, it will be appreciated by those of skill in the art that combinations, subsets, and extensions of these protocols will also provide useful results in various situations, applications, and environments.

In a first example protocol, a high resolution voltage sampler measures leakage current in a battery cell. This first example process includes the following operational steps:
1. measure a voltage of cell with high resolution voltage sampler;
2. apply the measured voltage to cell with voltage source;
3. measure a current until signal is steady state (di/dt<threshold); and
4. report the current value as leakage current.

In a second example protocol, data is compared over a cell's lifetime. This second example process includes the following operational steps:
1. measure voltage of cell with high resolution voltage sampler;
2. report the voltage to the controller to determine the state of charge and expected time of measurement;
3. apply voltage to cell with voltage source;
4. measure current with current detection units in expected time range;
5. compare leakage values and patterns with stored data;
6. report value and changes of value measured before; and
7. report warnings of cell failure if value higher the threshold.

In a third example protocol, failure mode recognition is based upon leakage assessment over different states of charge. This third example process includes the following operational steps:
1. measure voltage of cell with high resolution voltage sampler;
2. report the voltage to the controller to determine the state of charge;
3. measure current with current detection units;
4. report the current to controller and store data;
5. bring the cell to next state of charge and repeat leakage current measurement;
6. determine failure mode based on measured leakage of different state of charge (e.g. gassing, short, SEI damage); and
7. report failure mode and warnings if values higher than threshold values.

In a fourth example protocol, transient current is detected. This fourth example process includes the following operational steps:
1. measure voltage of cell with high resolution voltage sampler;
2. measure current with current detection units;
3. pattern recognition of transient current evolvement;
4. stop or repeat measurement based on patterns;
5. report value and signal pattern; and
6. report failure mode and warnings if values higher than threshold values (instability of cells, dendrites, side reaction . . . ).

In a fifth example protocol, measurement, time is decreased. This fifth example process includes the following operational steps:
1. measure voltage of cell with high resolution voltage sampler;
2. apply voltage to the cell;
3. measure current with current detection units;
4. based on current response increase or decrease the applied voltage;
5. repeat voltage adjustment until current reaches a steady state condition;
6. report value; and
7. report failure mode and warnings if values higher than threshold values (instability of cells, dendrites, side reaction . . . ).

In a sixth example protocol, measurement time is decreased with a current fitting algorithm. This seventh example process includes the following operational steps;
1. measure voltage of cell with high resolution voltage sampler;
2. apply voltage to the cell;
3. measure current with current detection units;
4. fit current response with fitting algorithm;
5. if fit is sufficient (reaching fitting criteria), stop measurements;
6. report predicted value based on the current fit; and
7. report failure mode and warnings if values higher than threshold values.

In a seventh example protocol, a high resolution comparator is employed. This eighth example process includes the following operational steps:

1. measure voltage of cell with high resolution voltage sampler;
2. set the voltage source to the closest lower value;
3. apply cell voltage and voltage from the voltage source to the comparator;
4. discharge the cell slowly until the cell voltage is the same as the voltage of the voltage source;
5. apply the voltage of the voltage source to the cell;
6. measure current until signal is steady state (di/dt<threshold); and
7. report the current value as leakage current.

It will be appreciated that the foregoing protocols be implemented with high resolution voltage sources and/or high resolution comparators as described above. Furthermore, the protocol examples can be combined and modified as desired for particular applications. For example, protocols can make a number of repeated measurements in order to improve noise and system robustness, early cell data can be compared with new data, cell life prediction can be based upon leakage data over time, "fitting" protocols can be used to predict leakage in shorter periods of time, self-learning protocols, can be employed, etc.

Figure 18:
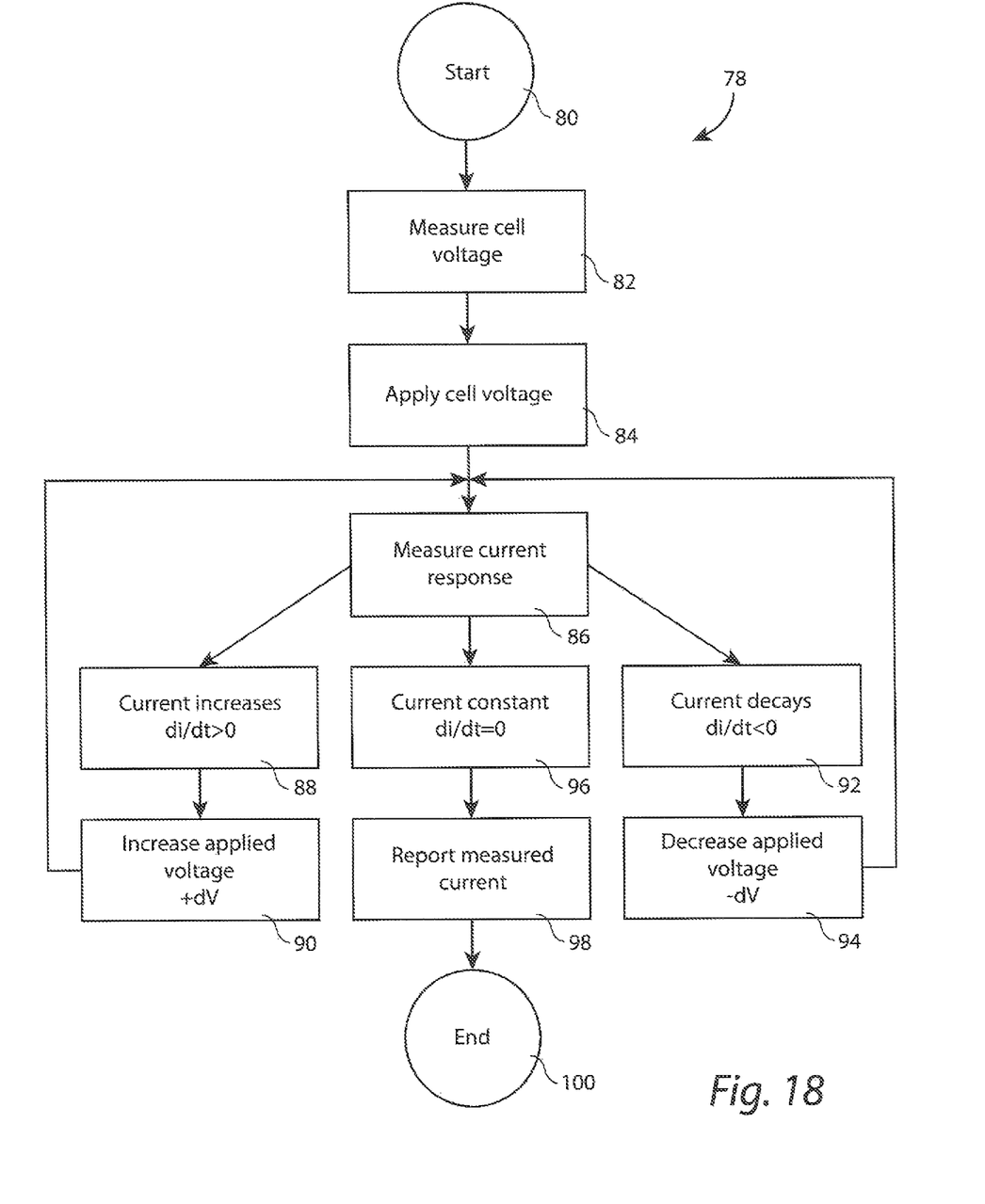
FIG. 18 is a flow diagram of an example method for shortening the time required for leakage current detection.

FIG. 18 is a flow diagram, set forth by way of example and not limitation, of a method or process 78 for shortening the time required for leakage current detection. With additional reference to FIG. 17, process 78 is preferably computer-implemented by, for example, storing code segments in memory 68 of a battery cell analyzing system 58 to be executed by a controller 66 (e.g. microprocessor or microcontroller). Process 78 begins at 80 and, in an operation 82, a cell voltage is measured. Next, in an operation 84, a cell voltage is applied and, in an operation 86, a current response is measured. If the current has increased (i.e. di/dt>0) as determined in an operation 88, the applied voltage is increased by +dV in an operation 90, after which process control is returned to operation 86. If the current has decayed (i.e. di/dt<0) as determined by an operation 92, the applied voltage is decreased by −dV in an operation 94 before process control is returned to operation 86. If the current is constant (i.e. di/dt=0) as determined, by an operation 96, the measured current is reported in an operation 98, and the process 78 is completed at 100.

Figure 19:
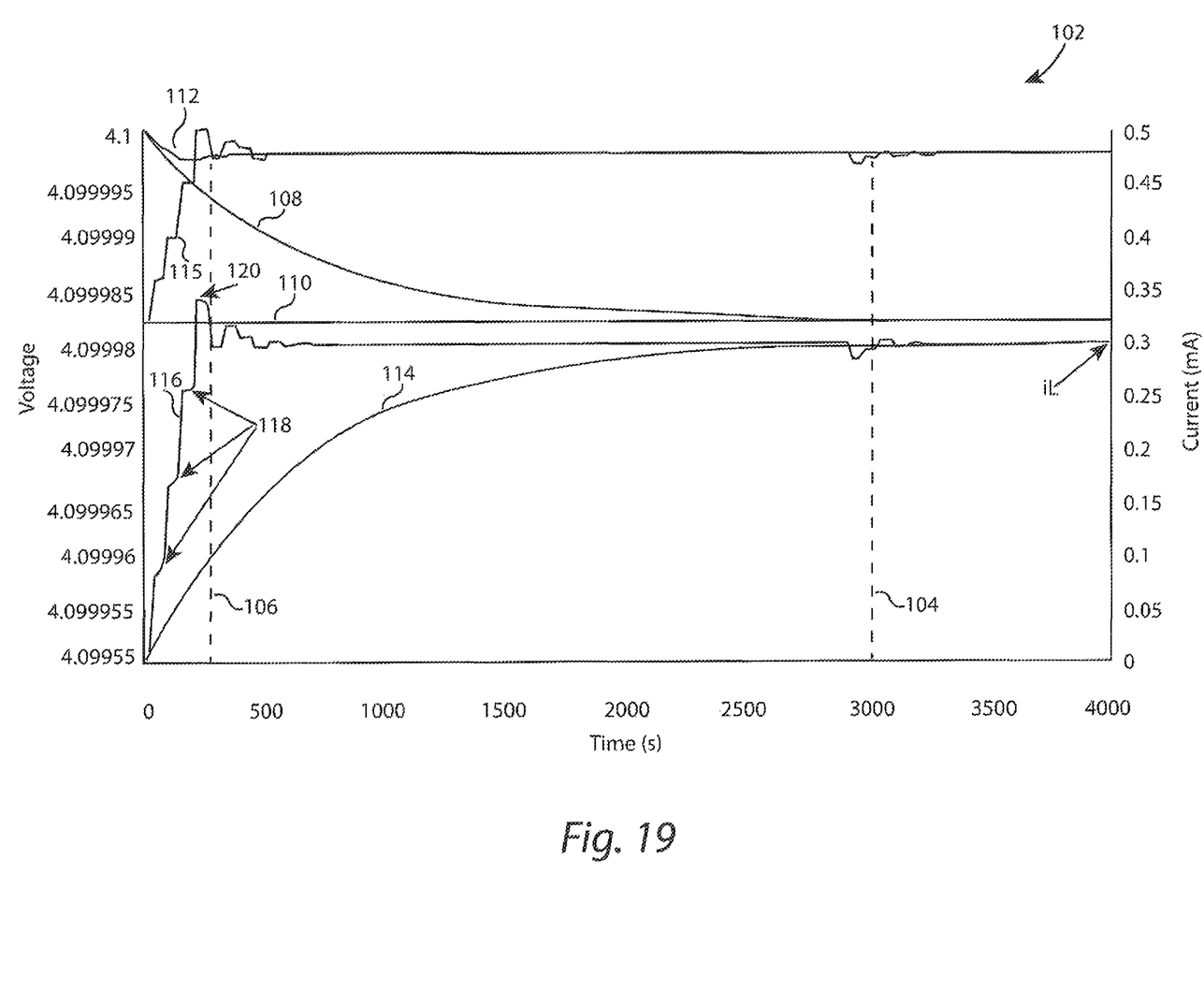
FIG. 19 is a graph illustrating how an example chasing method can be used to shorten the time required for leakage current detection.

The process of 78 of FIG. 18 may be considered to be implementing a "chasing method" to shorten the time required for current leakage detection. A graph 102 of FIG. 19 illustrates shows how the chasing method can be used to shorten the detection time from 50 minutes (see broken line 104) to 5 minutes (see broken line 106), in a non-limiting example. In FIG. 17, open circuit voltage (OCV) 108 shows the internal OCV of the cell without using the chasing method. As the current (Isupply) 114 rises to a leakage level of 300 uA, OCV 108 approaches the external voltage of the cell for non-chasing case, Vext 110. In contrast, when using the example chasing method, different external potentials (Vext_chase) 114 are applied for a certain period of time and assess whether the current (Curr_Chase) 116 is rising or decaying. Based on this, the current corresponding to the match of Vext_Chase 114 and OCV_Chase 112, which is the internal OCV of the cell for chasing case. It will be noted that this current is equal to the 300 uA leakage current that was to be detected.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A method for determining a leakage current of a battery cell comprising;
   measuring a cell voltage of a battery cell to determine an initial voltage;
   applying the initial voltage to the battery cell, using a voltage source;
   measuring a current response of the battery cell to the voltage applied by the voltage source;
   increasing the applied voltage if the measured current is increasing and repeating the measuring step;
   decreasing the applied voltage if the measured current is decreasing and repeating the measuring step; and
   determining the leakage current of the cell by the applied voltage when the measured current is constant.

2. A method for deter ruining a leakage current of a battery as recited in claim 1 wherein current is determined to be increasing when di/dt>0 and current is determined to be decreasing when di/dt<0.

3. A method for determining a leakage current of a battery as recited in claim 2 wherein the applied voltage is increased by +dv when di/dt>0.

4. A method for determining a leakage current of a battery as recited in claim 3 wherein the applied voltage is decreased by −dV when di/dt<0.

5. A method for determining a leakage current of a battery as recited in claim 1 wherein measuring a cell voltage uses a high resolution voltage sampler.

6. A method for determining a leakage current of a battery as recited in claim 1 wherein measuring a cell voltage uses a rough digital-to-analog converter (DAC) and a fine digital-to-analog converter (DAC).

7. An integrated circuit device comprising:
   a controller;
   a voltage source coupled to the controller;
   a voltage sampler coupled to the controller;
   a low current detector coupled to the controller; and
   memory coupled to the controller, the memory including code segments executable by the controller for:
   (a) measuring a cell voltage of a battery cell to determine an initial voltage;
   (b) applying the initial voltage to the battery cell using a voltage source;
   (c) measuring a current response of the battery cell to the voltage applied by the voltage source;
   (d) increasing the applied voltage if the measured current is increasing and repeating measuring step (c);
   (e) decreasing the applied voltage if the measured current is decreasing and repeating measuring step. (c); and
   (f) determining the leakage current of the cell by the applied voltage when the measured current is constant.

8. An integrated circuit device as recited in claim 7 wherein current is determined to be increasing when di/dt>0 and current is determined to be decreasing when di/dt<0.

9. An integrated circuit device as recited in claim 8 wherein the applied voltage is increased by +dv when di/dt>0.

10. An integrated circuit device as recited in claim 9 wherein the applied voltage is decreased by −dV when di/dt<0.

11. An integrated circuit device as recited in claim 7 wherein measuring a cell voltage uses a high resolution voltage sampler.

12. An integrated circuit device as recited in claim 7 wherein measuring a cell voltage uses a rough digital-to-analog converter (DAC) and a fine digital-to-analog converter (DAC).

13. A non-transitory computer readable medium including code segments executable by a processor for:
  a) measuring a cell voltage with a voltage sampler to determine an initial voltage;
  b) holding the cell voltage at the initial voltage using a voltage source;
  c) measuring the current provided by the voltage source with a low current detector;
  d) increasing the voltage of the voltage source if the measured current is increasing, decreasing the voltage of the voltage source if the measured current is decaying, and repeating operations c and d until the measured current is the same as a previously measured current:, and
  (e) correlating the measured current that is the same as the previously measured current to the leakage current of the cell.

* * * * *